(12) United States Patent
Pandev et al.

(10) Patent No.: US 12,209,854 B2
(45) Date of Patent: Jan. 28, 2025

(54) METHODS AND SYSTEMS FOR MEASUREMENT OF TILT AND OVERLAY OF A STRUCTURE

(71) Applicant: KLA Corporation, Milpitas, CA (US)

(72) Inventors: Stilian Ivanov Pandev, Santa Clara, CA (US); Min-Yeong Moon, Ann Arbor, MI (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/725,339

(22) Filed: Apr. 20, 2022

(65) Prior Publication Data

US 2022/0404143 A1 Dec. 22, 2022

Related U.S. Application Data

(60) Provisional application No. 63/212,112, filed on Jun. 18, 2021.

(51) Int. Cl.
*G01B 11/24* (2006.01)
*G01B 11/26* (2006.01)

(52) U.S. Cl.
CPC ............. *G01B 11/24* (2013.01); *G01B 11/26* (2013.01); *G01B 2210/56* (2013.01)

(58) Field of Classification Search
CPC .... G01B 11/24; G01B 11/26; G01B 2210/56; G01B 15/02; G03F 7/70633; G01N 23/205; G01N 23/201
See application file for complete search history.

(56) References Cited

U.S. PATENT DOCUMENTS 5,608,526 A 3/1997 Piwonka-Corle et al.
5,859,424 A 1/1999 Norton et al.
(Continued)

FOREIGN PATENT DOCUMENTS

KR 10-2015-0141241 A 12/2015

OTHER PUBLICATIONS

Lemaillet, Germer, Kline et al.,"Intercomparison between optical and x-ray scatterometry measurements of FinFET structures" by Proc. SPIE, v.8681, p. 86810Q (2013).
(Continued)

*Primary Examiner* — Mohamed K Amara
(74) *Attorney, Agent, or Firm* — Spano Law Group; Joseph S. Spano

(57) ABSTRACT

Methods and systems for measurement of wafer tilt and overlay are described herein. In some embodiments, the measurements are based on the value of an asymmetry response metric and known wafer statistics. Spectral measurements are performed at two different azimuth angles, preferably separated by one hundred eighty degrees. A sub-range of wavelengths is selected with significant signal sensitivity to wafer tilt or overlay. An asymmetry response metric is determined based on a difference between the spectral signals measured at the two different azimuth angles within the selected sub-range of wavelengths. The value of the asymmetry response metric is mapped to an estimated value of wafer tilt or overlay. In some other embodiments, the measurement of wafer tilt or overlay is based on a trained measurement model. Training data may be programmed or determined based on one or more asymmetry response metrics at two different azimuth angles.

18 Claims, 9 Drawing Sheets

(56) References Cited

U.S. PATENT DOCUMENTS

| | | | |
|---|---|---|---|
| 6,023,338 A | 2/2000 | Bareket | |
| 6,429,943 B1 | 8/2002 | Opsal et al. | |
| 6,716,646 B1 | 4/2004 | Wright et al. | |
| 6,778,275 B2 | 8/2004 | Bowes | |
| 6,787,773 B1 | 9/2004 | Lee | |
| 6,992,764 B1 | 1/2006 | Yang et al. | |
| 7,242,477 B2 | 7/2007 | Mieher et al. | |
| 7,289,214 B1 | 10/2007 | Li et al. | |
| 7,321,426 B1 | 1/2008 | Poslavsky et al. | |
| 7,406,153 B2 | 7/2008 | Berman | |
| 7,478,019 B2 | 1/2009 | Zangooie et al. | |
| 7,626,702 B2 | 12/2009 | Ausschnitt et al. | |
| 7,656,528 B2 | 2/2010 | Abdulhalim et al. | |
| 7,826,071 B2 | 11/2010 | Shchegrov et al. | |
| 7,842,933 B2 | 11/2010 | Shur et al. | |
| 7,873,585 B2 | 1/2011 | Izikson | |
| 7,929,667 B1 | 4/2011 | Zhuang et al. | |
| 7,933,026 B2 | 4/2011 | Opsal et al. | |
| 8,068,662 B2 | 11/2011 | Zhang et al. | |
| 8,138,498 B2 | 3/2012 | Ghinovker | |
| 9,291,554 B2 | 3/2016 | Kuznetsov et al. | |
| 9,470,639 B1 * | 10/2016 | Zhuang | G01N 21/211 |
| 9,597,004 B2 * | 3/2017 | Hughes | G16H 40/67 |
| 9,826,614 B1 | 11/2017 | Bakeman et al. | |
| 9,875,946 B2 * | 1/2018 | Shchegrov | H01L 22/20 |
| 9,885,962 B2 | 2/2018 | Veldman et al. | |
| 9,915,522 B1 | 3/2018 | Jiang et al. | |
| 10,013,518 B2 | 7/2018 | Bakeman et al. | |
| 10,101,670 B2 | 10/2018 | Pandev et al. | |
| 10,152,678 B2 | 12/2018 | Pandev et al. | |
| 10,216,096 B2 * | 2/2019 | Lee | G03F 7/70641 |
| 10,324,050 B2 | 6/2019 | Hench et al. | |
| 10,345,095 B1 * | 7/2019 | Pandev | H01L 22/20 |
| 10,352,695 B2 | 7/2019 | Dziura et al. | |
| 10,354,929 B2 * | 7/2019 | Pandev | G01B 11/24 |
| 10,365,225 B1 * | 7/2019 | Pandev | G01B 11/00 |
| 10,817,746 B2 * | 10/2020 | Harrison | G06T 7/97 |
| 11,313,809 B1 * | 4/2022 | Pandev | H01L 21/67288 |
| 2003/0021465 A1 | 1/2003 | Adel et al. | |
| 2007/0176128 A1 | 8/2007 | Van Bilsen et al. | |
| 2007/0221842 A1 | 9/2007 | Morokuma et al. | |
| 2009/0152463 A1 | 6/2009 | Toyoda et al. | |
| 2011/0080585 A1 * | 4/2011 | Rabello | G01B 11/24 356/369 |
| 2011/0266440 A1 | 11/2011 | Boughorbel et al. | |
| 2012/0292502 A1 | 11/2012 | Langer et al. | |
| 2013/0208279 A1 | 8/2013 | Smith | |
| 2013/0242303 A1 | 9/2013 | Liu | |
| 2013/0304424 A1 | 11/2013 | Bakeman et al. | |
| 2014/0019097 A1 | 1/2014 | Bakeman et al. | |
| 2014/0064445 A1 | 3/2014 | Adler | |
| 2014/0111791 A1 | 4/2014 | Manassen et al. | |
| 2014/0172394 A1 | 6/2014 | Kuznetsov et al. | |
| 2014/0222380 A1 | 8/2014 | Kuznetsov et al. | |
| 2014/0297211 A1 | 10/2014 | Pandev et al. | |
| 2015/0046118 A1 * | 2/2015 | Pandev | G03F 7/70641 702/155 |
| 2015/0046121 A1 | 2/2015 | Dziura et al. | |
| 2015/0110249 A1 | 4/2015 | Bakeman et al. | |
| 2015/0117610 A1 | 4/2015 | Veldman et al. | |
| 2015/0204664 A1 | 7/2015 | Bringoltz et al. | |
| 2015/0285749 A1 | 10/2015 | Moncton et al. | |
| 2015/0300965 A1 | 10/2015 | Sezginer et al. | |
| 2015/0355108 A1 * | 12/2015 | Park | G01N 21/211 702/182 |
| 2016/0117812 A1 * | 4/2016 | Pandev | G06F 18/214 382/149 |
| 2016/0117847 A1 | 4/2016 | Pandev et al. | |
| 2016/0202193 A1 | 7/2016 | Hench et al. | |
| 2016/0320319 A1 | 11/2016 | Hench et al. | |
| 2017/0167862 A1 * | 6/2017 | Dziura | G01N 23/205 |
| 2018/0106735 A1 | 4/2018 | Gellineau et al. | |
| 2018/0113084 A1 | 4/2018 | Hench et al. | |
| 2018/0328868 A1 | 11/2018 | Bykanov et al. | |
| 2019/0017946 A1 | 1/2019 | Wack et al. | |
| 2019/0033234 A1 * | 1/2019 | Ben Ezer | G01N 21/95623 |
| 2019/0293578 A1 | 9/2019 | Gellineau | |
| 2022/0352041 A1 * | 11/2022 | Pandev | G06F 18/21322 |
| 2022/0390856 A1 * | 12/2022 | Asano | G03F 7/70516 |
| 2023/0025299 A1 * | 1/2023 | Tokida | G06T 7/0004 |

OTHER PUBLICATIONS

Kline et al., "X-ray scattering critical dimensional metrology using a compact x-ray source for next generation semiconductor devices," J. Micro/Nanolith. MEMS MOEMS 16(1), 014001 (Jan.-Mar. 2017).
International Search Report mailed on Sep. 28, 2022, for PCT Application No. PCT/US2022/032925 filed on Jun. 10, 2022 by KLA Corporation, 3 pages.

* cited by examiner

METHODS AND SYSTEMS FOR MEASUREMENT OF TILT AND OVERLAY OF A STRUCTURE

CROSS REFERENCE TO RELATED APPLICATION

The present application for patent claims priority under 35 U.S.C. § 119 from U.S. provisional patent application Ser. No. 63/212,112, entitled "Method for estimating tilt and overlay of a structure," filed Jun. 18, 2021, the subject matter of which is incorporated herein by reference in its entirety.

TECHNICAL FIELD

The described embodiments relate to metrology systems and methods, and more particularly to methods and systems for improved overlay measurement.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. X-Ray and optical metrology techniques offer the potential for high throughput without the risk of sample destruction. A number of X-ray and optical metrology based techniques including scatterometry and reflectometry implementations and associated analysis algorithms are commonly used to characterize critical dimensions, film thicknesses, composition, overlay and other parameters of nanoscale structures.

Semiconductor devices are often fabricated by depositing a series of layers on a substrate. Some or all of the layers include various patterned structures. The relative position of structures both within particular layers and between layers is critical to the performance of completed electronic devices. Overlay refers to the relative position of overlying or interlaced structures on the same or different layers of a wafer. Overlay error refers to deviations from the nominal (i.e., desired) relative position of overlying or interlaced structures. The greater the overlay error, the more the structures are misaligned. If the overlay error is too great, the performance of the manufactured electronic device may be compromised.

In some examples, overlay error is evaluated based on measurements of specialized target structures formed at various locations on the wafer by a lithography tool. Traditionally, optical metrology techniques have been employed to perform overlay measurements. In some examples, image based overlay (IBO) metrology techniques are employed. IBO measurements involve imaging specialized targets based on reflected light. The target structures may take many forms, such as a box in box structure or bar-in-bar structure. In one example, a box is created on one layer of the wafer and a second, smaller box is created on another layer. The localized overlay error is measured by comparing the alignment between the centers of the two boxes. Such measurements are taken at locations on the wafer where target structures are available. The overlay is measured by processing each image to estimate the distance between target features printed on different layers from the measured images.

Unfortunately, these specialized target structures often do not conform to the design rules of the particular semiconductor manufacturing process being employed to generate the electronic device. This leads to errors in estimation of overlay errors associated with actual device structures that are manufactured in accordance with the applicable design rules. For example, IMO metrology often requires the pattern to have thick lines with critical dimensions far exceeding design rule critical dimensions to be successfully resolved with an optical microscope.

In some other examples, light scattered or diffracted from overlay targets is employed to estimate overlay. Scatterometry based overlay metrology techniques, commonly referred to as scatterometry overlay (SCOL) or diffraction based overlay (DBO), are based primarily on differential measurements of optical signals corresponding to diffraction from two different targets, each with programmed overlay offsets. The unknown overlay error is extracted based on these differential measurements.

Traditionally, the lack of robustness to process variations in SCOL and DBO (i.e., changes in non-overlay parameters that affect measured asymmetry) is addressed by selecting a specific illumination wavelength that is less sensitive to process variations and optimizing the target design to reduce sensitivity to process variations. Unfortunately, both of these approaches are limited in their effectivity. For example, the selection of a specific illumination wavelength may result in small overlay measurement errors, but only within a small range of the full process window. This makes the measurement unreliable and inconsistent, requiring frequent reevaluation of illumination wavelength. Target design optimization is very time consuming and requires accurate models of the structures, material dispersions, and the optical system. It is also very challenging to verify the accuracy of the models because the mask and targets are typically not available at the time of recipe development. In addition, target optimization may reduce measurement sensitivity to process variations, but does not fully address robustness to the full window of process variations.

Conventional SCOL and DBO techniques require four different targets (e.g., a metrology target having four different cells) to measure overlay in two directions (i.e., two cells associated with each different direction). This increases move-acquire-measure (MAM) times and target area on the wafer.

In addition, the overlay accuracy of conventional SCOL and DBO techniques is significantly affected by optical system variations and aberrations. This makes it difficult to achieve accurate overlay measurements and sufficiently accurate tool matching.

In general, traditional measurement of overlay requires specially designed targets, specially designed Design Of Experiments (DOE) wafers, a measurement model, or external reference measurements.

Future overlay metrology applications present challenges for metrology due to increasingly small resolution requirements and the increasingly high value of wafer area. Thus, methods and systems for improved tilt and overlay measurements are desired.

SUMMARY

Methods and systems for measurement of wafer tilt and overlay are described herein.

In some embodiments, the measurements are based on the value of an asymmetry response metric and known wafer statistics. The estimates of wafer tilt and overlay are achieved without a measurement model, without external reference measurements, and without specially designed targets and DOE wafers.

Spectral measurements are performed at two different azimuth angles, preferably separated by one hundred eighty degrees. A sub-range of wavelengths is selected with significant signal sensitivity to wafer tilt or overlay. An asymmetry response metric is determined based on a difference between the spectral signals measured at the two different azimuth angles within the selected sub-range of wavelengths. The value of the asymmetry response metric is mapped to an estimated value of the parameter of interest, e.g., wafer tilt or overlay. The mapping is based on known wafer statistics.

In some other embodiments, the measurement of wafer tilt or overlay is based on a trained measurement model.

In some of these embodiments, the measurement model is trained from raw spectral response data collected from Design of Experiments (DOE) wafers. Each measurement site includes one or more metrology targets fabricated with programmed overlay skew variations, i.e., known magnitude and rotation of skew at each measurement site, and known wafer tilt at time of measurement. The measured spectra, the programmed overlay skew variations, and known wafer tilt are employed to train a machine learning model. An analytical approximation of tilt of the overlay skew wafer is employed as a reference for training of the machine learning based model.

In some embodiments, the measurement model is trained from raw spectral response data collected from wafers having values of wafer tilt estimated based on one or more asymmetry response metrics associated with spectral measurements of one or more structures at two different azimuth angles as described herein.

The trained model is employed to accurately estimate wafer tilt from measurements of nominal production wafers fabricated with the same nominal structures as the training wafers.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for measurement of wafer tilt and overlay based on asymmetry response metrics and known wafer statistics are described herein. The estimates of wafer tilt and overlay are achieved without a measurement model, without external reference measurements, and without specially designed targets and DOE wafers.

Spectral measurements are performed at two different azimuth angles, preferably separated by one hundred eighty degrees. Spectral measurements include any suitable broadband x-ray or optical based metrology technique sensitive to structural asymmetry. A sub-range of wavelengths is selected with significant signal sensitivity to wafer tilt. An asymmetry response metric is determined based on a difference between the spectral signals measured at the two different azimuth angles within the selected sub-range of wavelengths. The value of the asymmetry response metric is mapped to an estimated value of the parameter of interest, e.g., wafer tilt or overlay. The mapping is based on a known within wafer range of values of the parameter of interest.

In addition, methods and systems for measurement of wafer tilt and overlay based on a trained measurement model are described herein. The measurement model is trained from raw spectral response data collected from Design of Experiments (DOE) wafers. Each measurement site includes one or more metrology targets fabricated with programmed overlay skew variations, i.e., known magnitude and rotation of skew at each measurement site, and known wafer tilt at time of measurement. The measured spectra, the programmed overlay skew variations, and known wafer tilt are employed to train a machine learning model. An analytical approximation of tilt of the overlay skew wafer is employed as a reference for training of the machine learning based model. The trained model is employed to accurately estimate wafer tilt from measurements of nominal production wafers fabricated with the same nominal structures as the DOE wafers.

Figure 1:
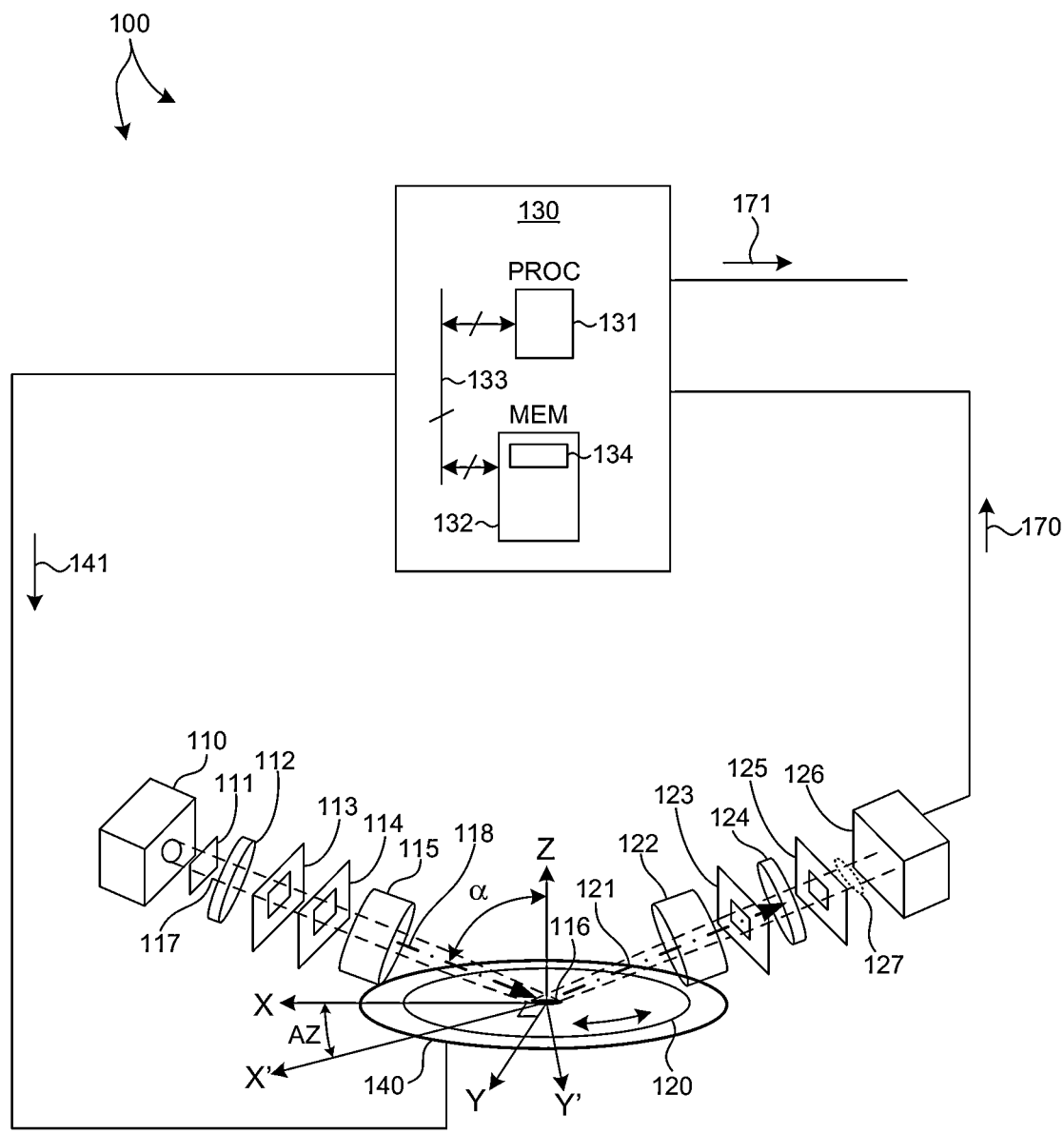
FIG. 1 illustrates a system for measuring overlay, wafer tilt, or both, in accordance with the exemplary methods presented herein.

FIG. 1 depicts an exemplary, metrology system 100 for performing measurements of structural features of semiconductor devices. As depicted in FIG. 1, metrology system 100 is configured as a broadband spectroscopic ellipsometer. However, in general, metrology system 100 may be configured as a spectroscopic reflectometer, scatterometer, ellipsometer, or any combination thereof.

Metrology system 100 includes an illumination source 110 that generates a beam of illumination light 117 incident on a wafer 120. In some embodiments, illumination source 110 is a broadband illumination source that emits illumination light in the ultraviolet, visible, and infrared spectra. In one embodiment, illumination source 110 is a laser sustained plasma (LSP) light source (a.k.a., laser driven plasma source). The pump laser of the LSP light source may be continuous wave or pulsed. A laser-driven plasma source can produce significantly more photons than a Xenon lamp across a wavelength range from 150 nanometers to 2000 nanometers. Illumination source 110 can be a single light source or a combination of a plurality of broadband or discrete wavelength light sources. The light generated by illumination source 110 includes a continuous spectrum or parts of a continuous spectrum, from ultraviolet to infrared (e.g., vacuum ultraviolet to mid infrared). In general, illumination light source 110 may include a super continuum laser source, an infrared helium-neon laser source, an arc lamp, or any other suitable light source.

In a further aspect, the amount of illumination light is broadband illumination light that includes a range of wavelengths spanning at least 500 nanometers. In one example, the broadband illumination light includes wavelengths below 250 nanometers and wavelengths above 750 nanometers. In general, the broadband illumination light includes wavelengths between 120 nanometers and 3,000 nanometers. In some embodiments, broadband illumination light including wavelengths beyond 3,000 nanometers may be employed.

As depicted in FIG. 1, metrology system 100 includes an illumination subsystem configured to direct illumination light 117 to one or more structures formed on the wafer 120. The illumination subsystem is shown to include light source 110, one or more optical filters 111, polarizing component 112, field stop 113, aperture stop 114, and illumination optics 115. The one or more optical filters 111 are used to control light level, spectral output, or both, from the illumination subsystem. In some examples, one or more multi-zone filters are employed as optical filters 111. Polarizing component 112 generates the desired polarization state exiting the illumination subsystem. In some embodiments, the polarizing component is a polarizer, a compensator, or both, and may include any suitable commercially available polarizing component. The polarizing component can be fixed, rotatable to different fixed positions, or continuously rotating. Although the illumination subsystem depicted in FIG. 1 includes one polarizing component, the illumination subsystem may include more than one polarizing component. Field stop 113 controls the field of view (FOV) of the illumination subsystem and may include any suitable commercially available field stop. Aperture stop 114 controls the numerical aperture (NA) of the illumination subsystem and may include any suitable commercially available aperture stop. Light from illumination source 110 is directed through illumination optics 115 to be focused on one or more structures (not shown in FIG. 1) on wafer 120. The illumination subsystem may include any type and arrangement of optical filter(s) 111, polarizing component 112, field stop 113, aperture stop 114, and illumination optics 115 known in the art of spectroscopic ellipsometry, reflectometry, and scatterometry.

As depicted, in FIG. 1, the beam of illumination light 117 passes through optical filter(s) 111, polarizing component 112, field stop 113, aperture stop 114, and illumination optics 115 as the beam propagates from the illumination source 110 to wafer 120. Beam 117 illuminates a portion of wafer 120 over a measurement spot 116.

Metrology system 100 also includes a collection optics subsystem configured to collect light generated by the interaction between the one or more structures and the incident illumination beam 117. A beam of collected light 127 is collected from measurement spot 116 by collection optics 122. Collected light 127 passes through collection aperture stop 123, polarizing element 124, and field stop 125 of the collection optics subsystem.

Collection optics 122 includes any suitable optical elements to collect light from the one or more structures formed on wafer 120. Collection aperture stop 123 controls the NA of the collection optics subsystem. Polarizing element 124 analyzes the desired polarization state. The polarizing element 124 is a polarizer or a compensator. The polarizing element 124 can be fixed, rotatable to different fixed positions, or continuously rotating. Although the collection subsystem depicted in FIG. 1 includes one polarizing element, the collection subsystem may include more than one polarizing element. Collection field stop 125 controls the field of view of the collection subsystem. The collection subsystem takes light from wafer 120 and directs the light through collection optics 122, and polarizing element 124 to be focused on collection field stop 125. In some embodiments, collection field stop 125 is used as a spectrometer slit for the spectrometers of the detection subsystem. However, collection field stop 125 may be located at or near a spectrometer slit of the spectrometers of the detection subsystem.

The collection subsystem may include any type and arrangement of collection optics 122, aperture stop 123, polarizing element 124, and field stop 125 known in the art of spectroscopic ellipsometry, reflectometry, and scatterometry.

In the embodiment depicted in FIG. 1, the collection optics subsystem directs light to spectrometer 126. Spectrometer 126 generates output responsive to light collected from the one or more structures illuminated by the illumination subsystem. In one example, the detectors of spectrometer 126 are charge coupled devices (CCD) sensitive to ultraviolet and visible light (e.g., light having wavelengths between 190 nanometers and 860 nanometers). In other examples, one or more of the detectors of spectrometer 126 is a photo detector array (PDA) sensitive to infrared light (e.g., light having wavelengths between 950 nanometers and 2500 nanometers). However, in general, other detector technologies may be contemplated (e.g., a position sensitive detector (PSD), an infrared detector, a photovoltaic detector, etc.). Each detector converts the incident light into electrical signals indicative of the spectral intensity of the incident light. In general, spectrometer 126 generates output signals 170 indicative of the spectral response of the structure under measurement to the illumination light.

Wafer stage 140 positions wafer 120 with respect to the ellipsometer. In some embodiments, wafer stage 140 moves wafer 120 in the XY plane by combining two orthogonal, translational movements (e.g., movements in the X and Y directions) to position wafer 120 with respect to the ellipsometer. In some embodiments, wafer stage 140 is configured to control the orientation of wafer 120 with respect to the illumination provided by the optical ellipsometer in six degrees of freedom. In one embodiment, wafer stage 140 is configured to control the azimuth angle, AZ, of wafer 120 with respect to the illumination provided by the optical ellipsometer by rotation about the z-axis. In general, specimen positioning system 140 may include any suitable combination of mechanical elements to achieve the desired linear and angular positioning performance, including, but not limited to goniometer stages, hexapod stages, angular stages, and linear stages. Computing system 130 is communicatively coupled to wafer stage 140 and communicates motion command signals 141 to wafer stage 140. In response, wafer stage 140 positions wafer 120 with respect to the ellipsometer in accordance with the motion control commands.

Metrology system 100 also includes computing system 130 configured to receive signals 170 indicative of the measured spectral response of the structure of interest and estimate values 171 of overlay, wafer tilt, or both, based on the measured spectral response.

In one aspect, an estimated value of overlay, wafer tilt, or both, is determined based on one or more asymmetry response metrics associated with spectral measurements of one or more structures at two different azimuth angles. The one or more structures are fabricated on a nominal semiconductor wafer having unknown overlay, wafer tilt, or both. In a preferred embodiment, spectral measurements are performed at two different azimuth angles separated by one hundred eighty degrees. Each asymmetry response metric is a scalar value derived from differences in the spectral response at the two different azimuth angles.

Figure 2:
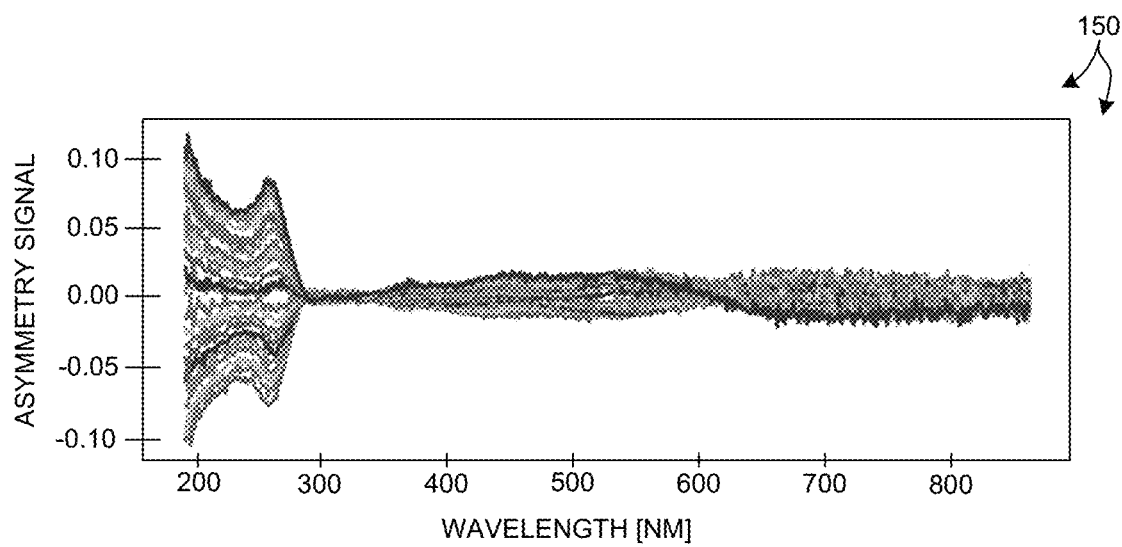
FIG. 2 is a plot illustrative of simulated asymmetry spectra indicative of structural asymmetry.

FIG. 2 is a plot 150 illustrative of simulated asymmetry spectra indicative of structural asymmetry. The asymmetry spectra are simulated for different values of overlay. Each asymmetry spectrum is determined as the difference between spectral measurements performed at a zero azimuth angle and an azimuth angle of one hundred eighty degrees. Equation (1) illustrates an example calculation of an asymmetry spectrum, $S_{asym}$, as the difference between the measured intensity associated with a measurement at an azimuth angle of 180 degrees, $S_{AZ180}$, and the measured intensity associated with a measurement of the same site at an azimuth angle of 0 degrees, $S_{AZ0}$, at each wavelength.

$$S_{asym} = S_{AZ180} - S_{AZ0} \qquad (1)$$

As illustrated in FIG. 2, the asymmetry spectrum is zero when the measured structures are symmetric. However, the asymmetry spectrum is nonzero when the measured structures are asymmetric. The asymmetry spectrum is positive or negative depending on the relative direction of the structural asymmetry. In addition, the magnitude of the asymmetry spectrum is proportional to the magnitude of actual structural asymmetry, e.g., overlay.

To relate the asymmetry spectrum to overlay, wafer tilt, or both, an asymmetry response metric is determined by integrating the asymmetry spectrum over a range of wavelengths. In one example, equation (2) illustrates the calculation of an asymmetry response metric, ARM, from the asymmetry spectrum illustrated in Equation (1), where i is an index of discrete wavelengths that spans the range of measured wavelengths, λ-range.

$$ARM = \Sigma_{i \in \lambda\text{-}range}(S_{AZ180_i} - S_{AZ0_i}) \qquad (2)$$

In general, an asymmetry response metric may be determined based on any suitable indication of the difference between measured spectra at different azimuth angles. In some examples, measurement accuracy is improved by employing selected Mueller Matrix elements as the indication of difference between measured spectra at different azimuth angles.

In some embodiments, the measured spectral response of the structure of interest includes spectra associated with elements of a Mueller matrix formulation employed to characterize the measured response. The Stokes-Mueller formalism describes the response of a medium to excitation by polarized light. Equation (3) illustrates a Mueller matrix, M, which describes the relationship between the incident beam, characterized by Stokes vector, $S_I$, and the reflected beam characterized by Stokes vector, $S_R$.

$$S_R = MS_I \qquad (3)$$

In general, the Stokes vector represents the state of polarization of a light wave. By way of example, Equation (4) illustrates a Stokes vector, S, where I is the total intensity, $I_0$ is the intensity transmitted by a linear polarizer oriented at an angle of zero degrees with respect the P polarization axis in the plane perpendicular to the propagation direction, $I_{45}$ is the transmitted by a linear polarizer oriented at an angle of 45 degrees with respect the P polarization axis in a plane perpendicular to the propagation direction, $I_{-45}$ is the intensity transmitted by a linear polarizer oriented at an angle of −45 degrees with respect the P polarization axis in a plane perpendicular to the propagation direction, $I_R$ is the intensity transmitted by a right circular polarizer, and $I_L$ is the intensity transmitted by a left circular polarizer. The quantities in brackets are spatially and temporally averaged.

$$S = \begin{bmatrix} I \\ \langle I_0 - I_{90} \rangle \\ \langle I_{45} - I_{-45} \rangle \\ \langle I_R - I_L \rangle \end{bmatrix} \qquad (4)$$

For a particular spectroscopic measurement, the illumination intensity and polarization properties of the incident beam are programmed. Thus, some or all of the elements of the Stokes vector associated with the incident beam, $S_I$, are known apriori. Furthermore, intensity and polarization properties of reflected beam are measured by the spectrometer (i.e., spectrometer 126). Thus, some or all of the elements of the Stokes vector associated with the reflected beam, $S_R$, are measured. As a result, some or all of the Mueller matrix elements are resolved based on the known and measured properties of the incident and reflected light, respectively. Equation (5) illustrates the elements of the Mueller matrix and their relationship with the known and measured elements of the Stokes vectors, $S_I$ and $S_R$, respectively.

$$S_R = \begin{bmatrix} M_{00} & M_{01} & M_{02} & M_{03} \\ M_{10} & M_{11} & M_{12} & M_{13} \\ M_{20} & M_{21} & M_{22} & M_{23} \\ M_{30} & M_{31} & M_{32} & M_{33} \end{bmatrix} S_I \qquad (5)$$

Some or all of the elements of the Mueller matrix may be determined directly from the known elements of the Stokes vectors, $S_I$ and $S_R$, based on the linear relationship illustrated in Equation (5). Whether some or all of the Mueller matrix elements are determined depends on the known intensity and polarization properties of the incident light and the measured intensity and polarization properties of the reflected light. For example, if polarizer 112 is configured as a rotating polarizer and polarizer 124 is configured as a rotating analyzer, the element in the first three rows and the first three columns of the Mueller matrix may be determined. If, in addition, rotating compensators are employed in the illumination path and the collection path of metrology system 100, all elements of the 4×4 Mueller matrix may be determined.

In preferred embodiments, an asymmetry response metric is determined using one or more off-diagonal Mueller Matrix elements as the indication of a difference between measured spectra at different azimuth angles. In some embodiments, the Mueller Matrix elements $M_{02}$ and $M_{20}$ are employed to determine an asymmetry response metric because of their high sensitivity to asymmetry. In one example, equation (6) illustrates the calculation of an asymmetry response metric, ARM, based on Mueller Matrix elements $M_{02}$ and $M_{20}$ where, i, is an index of discrete wavelengths that spans the range of measured wavelengths, λ-range, $(M_{02}+M_{20})^{AZ180}$ is the sum of the Mueller Matrix elements $M_{02}$ and $M_{20}$ associated with a spectral measurement at an azimuth angle of 180 degrees, and $(M_{02}+M_{20})^{AZ0}$ is the sum of the Mueller Matrix elements $M_{02}$ and $M_{20}$ associated with a spectral measurement at an azimuth angle of 0 degrees.

$$ARM=\Sigma_{i\in\lambda\text{-range}}((M_{02}+M_{20})^{AZ180}-(M_{02}+M_{20})^{AZ180})_i \quad (6)$$

In a further aspect, a sub-range of wavelengths of the measured spectral response of the one or more structures is selected to estimate the value of an asymmetry response metric employed to estimate wafer tilt or overlay. Furthermore, in some examples, different sub-ranges of wavelengths of the measured spectral response are selected to realize different values of an asymmetry response metric to estimate wafer tilt and overlay, respectively.

Figure 3:
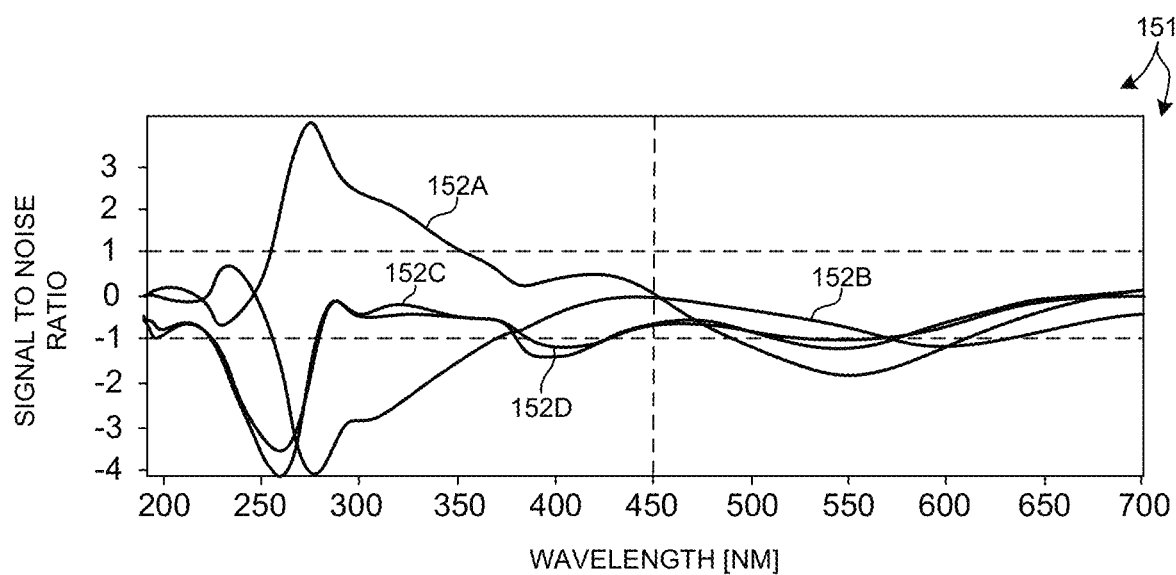
FIG. 3 is a plot illustrative of a signal to noise ratio associated with measurements of four different off-diagonal Mueller Matrix elements indicative of structural asymmetry due to overlay of a measured DRAM structure.

FIG. 3 is a plot 151 illustrative of a signal to noise ratio associated with measurements of four different off-diagonal Mueller Matrix elements indicative of structural asymmetry due to overlay of a measured DRAM structure. Plotlines 152A-D illustrate the signal to noise ratio associated with the four different off-diagonal Mueller Matrix elements, respectively.

Figure 4:
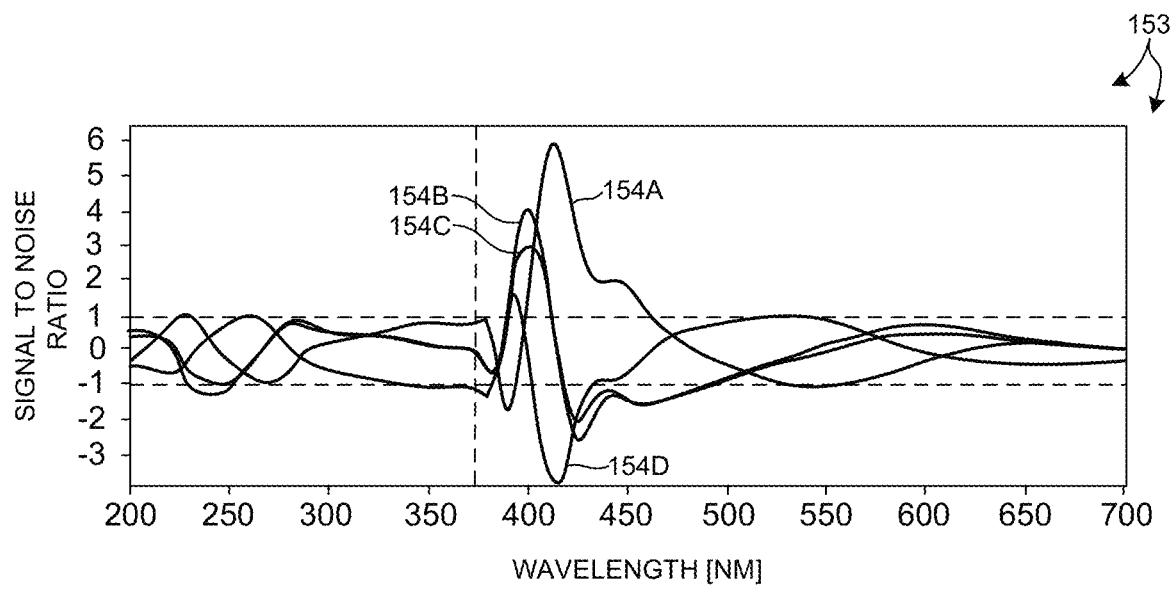
FIG. 4 is a plot illustrative of a signal to noise ratio associated with measurements of four different off-diagonal Mueller Matrix elements indicative of structural asymmetry due to tilt of a measured DRAM structure.

FIG. 4 is a plot 153 illustrative of a signal to noise ratio associated with measurements of four different off-diagonal Mueller Matrix elements indicative of structural asymmetry due to wafer tilt of a measured DRAM structure. Plotlines 154A-D illustrate the signal to noise ratio associated with four different off-diagonal Mueller Matrix elements, respectively.

FIGS. 3 and 4 illustrate that for significant portions of the illumination spectrum, the measurement signal is buried within the noise floor, i.e., signal to noise ratio between −1 and 1. FIGS. 3 and 4 also illustrate that measurement sensitivity to overlay of a DRAM structure is higher within a wavelength range between 200 nanometers and 450 nanometers, and measurement sensitivity to wafer tilt of a DRAM structure is higher within a wavelength range between 375 nanometers and 500 nanometers. Thus, in general, shorter wavelengths should be selected to estimate overlay, while longer wavelengths should be selected to estimate wafer tilt. In some examples, the sub-range of wavelengths employed to determine the value of an asymmetry response metric is achieved by selecting a sub-range of wavelengths having a spectral response that exceeds a predetermined threshold value within the selected sub-range of wavelengths.

In another further aspect, an estimated value of overlay, wafer tilt, or both, is based on a mapping of a value of an asymmetry response metric to the estimated value. As described hereinbefore, a value of the asymmetry response metric is proportional to overlay or wafer tilt depending on the selected wavelength range, Mueller elements, or both. In addition, prior domain knowledge is used to calibrate the measurement and effectively map values of the asymmetry response metric to values of overlay or wafer tilt.

In one example, it is known that the range of within wafer (WIW) overlay variation is +/−2 nanometers for a nominal production wafer. In this example, a mapping is generated that scales the values of the asymmetry signal to values within the known range of overlay. In some examples, the accuracy of the mapping is improved by considering the range of WIW overlay variation over multiple wafers.

Figure 5:
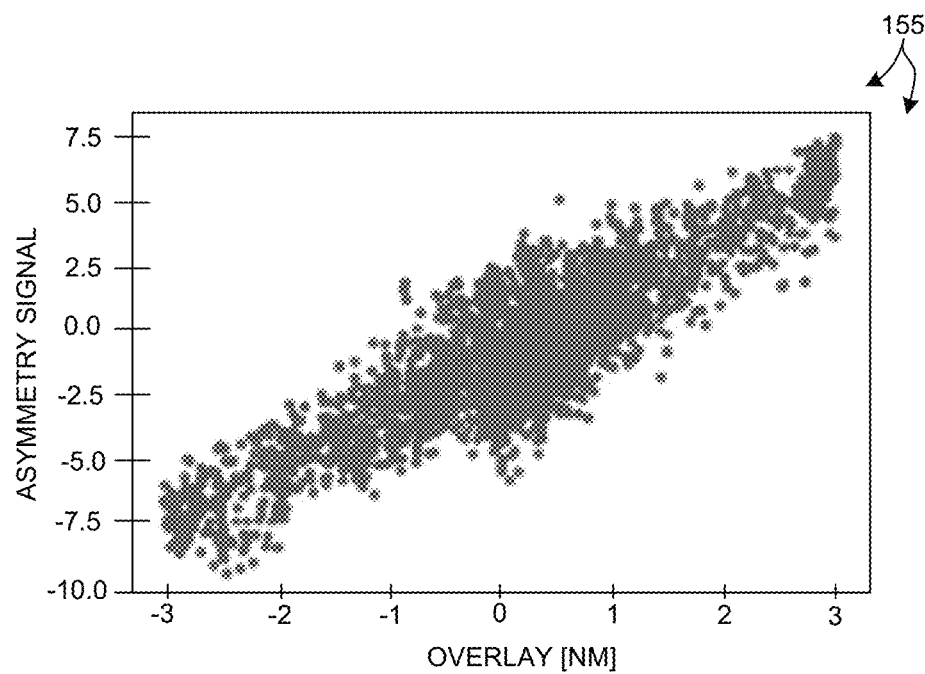
FIG. 5 depicts a plot illustrative of a scatter plot of values of overlay at a large number of measurement sites measured by a trusted reference metrology system and corresponding measured values of the asymmetry response metric at the same measurement sites.

FIG. 5 depicts a plot 155 illustrating a scatter plot of values of overlay at a large number of measurement sites measured by a trusted reference metrology system (scanning electron microscope) along the x-axis and corresponding measured values of the asymmetry response metric at the same measurement sites along the y-axis. As depicted in FIG. 5, the asymmetric response metric is linearly proportional to actual overlay.

In a further aspect, a mapping is generated that relates values of an asymmetry response metric to values of overlay or wafer tilt, e.g., a mathematical function having a value of an asymmetry response metric as an input and an estimated value of overlay or wafer tilt as an output.

Equation (7) illustrates an exemplary mapping function relating an asymmetry response metric (ARM) value to the estimated value of overlay, OVL, at a measurement site. As illustrated in Equation (7), $ARM_{OVL}$ is the value of an asymmetry response metric associated with an overlay measurement, $OVL_{WIW}^{UB}$ is the upper bound of a 3-sigma range of values of overlay within a wafer or set of wafers, $OVL_{WIW}^{LB}$ is the lower bound of a 3-sigma range of values of overlay within the wafer or set of wafers, $ARM_{WIW}^{UB}$ is the upper bound of a 3-sigma range of values of overlay within the wafer or set of wafers, $ARM_{WIW}^{LB}$ is the lower bound of a 3-sigma range of values of overlay within the wafer or set of wafers, and α is the zero asymmetry offset value associated with the overlay measurement.

$$OVL = ARM_{OVL}\left(\frac{OVL_{WIW}^{UB} - OVL_{WIW}^{LB}}{ARM_{WIW}^{UB} - ARM_{WIW}^{LB}}\right) + OVL_{WIW}^{LB} - ARM_{WIW}^{LB} + \alpha_{OVL} \quad (7)$$

Equation (8) illustrates an exemplary mapping function relating an asymmetry response metric (ARM) value to the estimated value of wafer tilt, TILT, at a measurement site. As illustrated in Equation (8), $ARM_{TILT}$ is the value of an asymmetry response metric associated with a tilt measurement, $TILT_{WIW}^{UB}$ is the upper bound of a 3-sigma range of values of overlay within a wafer or set of wafers, $TILT_{WIW}^{LB}$ is the lower bound of a 3-sigma range of values of overlay within the wafer or set of wafers, $ARM_{WIW}^{UB}$ is the upper bound of a 3-sigma range of values of overlay within the wafer or set of wafers, $ARM_{WIW}^{LB}$ is the lower bound of a 3-sigma range of values of overlay within the wafer or set of wafers, and $\alpha_{TILT}$ is the zero asymmetry offset value associated with the tilt measurement.

$$TILT = \qquad (8)$$

$$ARM_{TILT} \left( \frac{TILT_{WTW}^{UB} - TILT_{WTW}^{LB}}{ARM_{WTW}^{UB} - ARM_{WTW}^{LB}} \right) + TILT_{WTW}^{LB} - ARM_{WTW}^{LB} + \alpha_{TILT}$$

Figure 6:
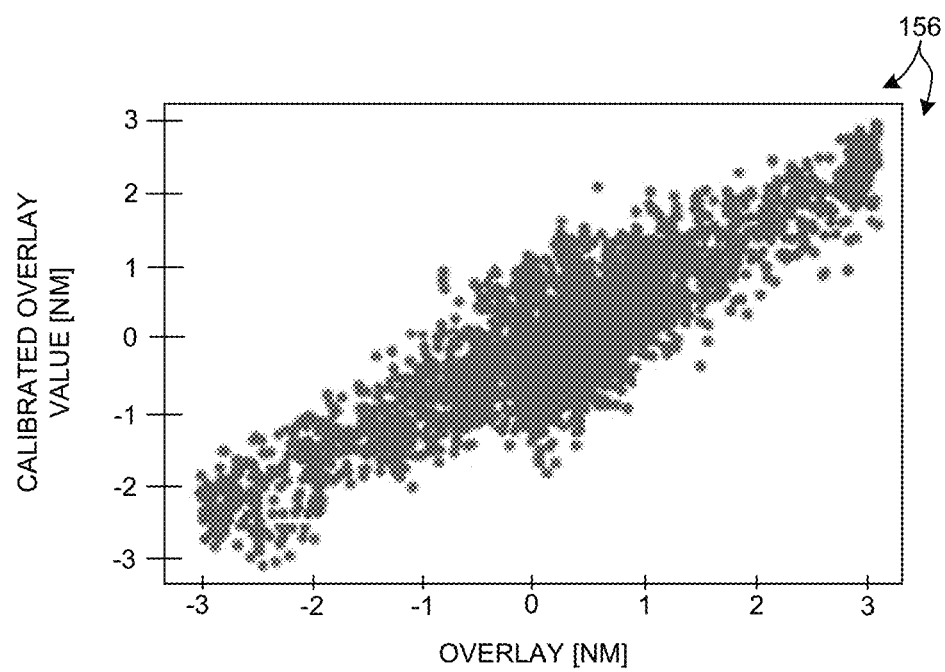
FIG. 6 depicts a plot illustrative of a scatter plot of measured values of overlay at a large number of measurement sites measured by a trusted reference metrology system and corresponding values of overlay estimated in accordance with the methods described herein.

FIG. 6 depicts a plot 156 illustrating a scatter plot of measured values of overlay at a large number of measurement sites measured by a trusted reference metrology system (scanning electron microscope) along the x-axis and corresponding values of overlay estimated in accordance with equation (7) at the same measurement sites along the y-axis. As depicted in FIG. 6, the estimated values of overlay track closely with overlay measured by a trusted reference metrology system.

In some embodiments, the differential signal is determined as the difference between an azimuth angle of 180 degrees, $AZ_{180}$, and an azimuth angle of 0 degrees, $AZ_0$, where the azimuth angles $AZ_{180}$ and $AZ_0$ are aligned with the y-direction of overlay on a wafer. Furthermore, the differential signal is determined as the difference between an azimuth angle of 270 degrees, $AZ_{270}$, and an azimuth angle of 90 degrees, $AZ_{90}$, where the azimuth angles $AZ_{270}$ and $AZ_{90}$ are aligned with the x-direction of overlay on a wafer.

In another aspect, a machine learning based measurement model is trained to measure wafer tilt at any location on a nominal production wafer. A machine learning based measurement model includes any suitable machine learning based model, e.g., a linear model, a neural network based model, a convolutional network model, etc.

In a further aspect, an analytical approximation of tilt of the overlay skew wafer is employed as a reference for training of the machine learning based model.

In some embodiments, the measurement model is trained from raw spectral response data collected from Design of Experiments (DOE) wafers having known wafer tilt and known, programmed overlay skew. Each measurement site includes one or more metrology targets fabricated with programmed overlay skew variations, i.e., known magnitude and rotation of skew at each measurement site, and known wafer tilt at time of measurement.

In some embodiments, the measurement model is trained from raw spectral response data collected from wafers having values of wafer tilt estimated based on one or more asymmetry response metrics associated with spectral measurements of one or more structures at two different azimuth angles as described hereinbefore.

Figure 7:
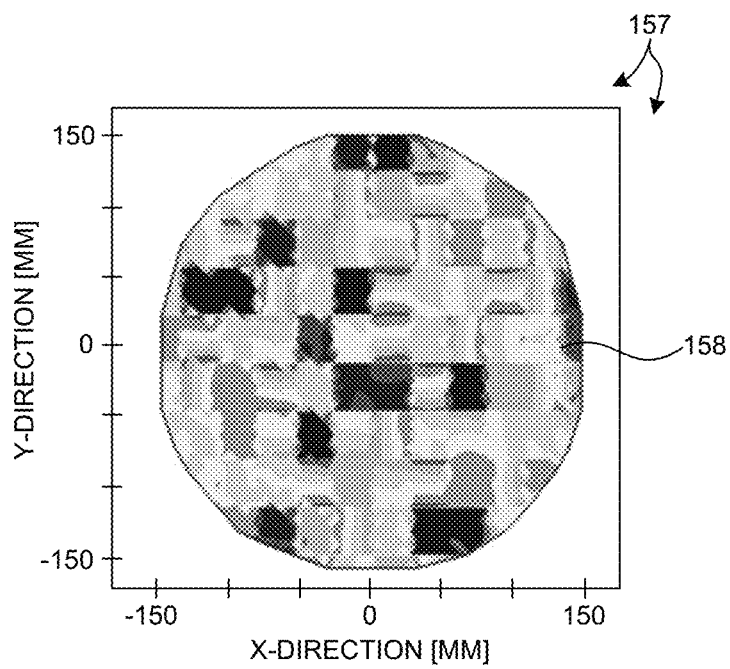
FIG. 7 is a diagram illustrative of a wafer map illustrating the magnitude of overlay at different locations on a wafer.

In some embodiments, a metrology system employs an illumination source to provide an amount of illumination radiation to one or more overlay structures fabricated on a Design Of Experiments (DOE) semiconductor wafer having different, known, programmed values of skew overlay and known wafer tilt. The overlay skew DOE wafer is measured to train a wafer tilt model. The overlay skew DOE wafer includes a programmed overlay magnitude and rotation skew at each field on the wafer. FIG. 7 is a diagram illustrative of a wafer map 157 illustrating the magnitude of overlay at different locations on wafer 158.

The metrology system employs a detector to detect DOE measurement radiation from the DOE semiconductor wafer in response to the illumination radiation. A computing system, e.g., computing system 130, trains the tilt measurement model based on the DOE measurement data and the programmed values of skew overlay and wafer tilt.

Figure 8:
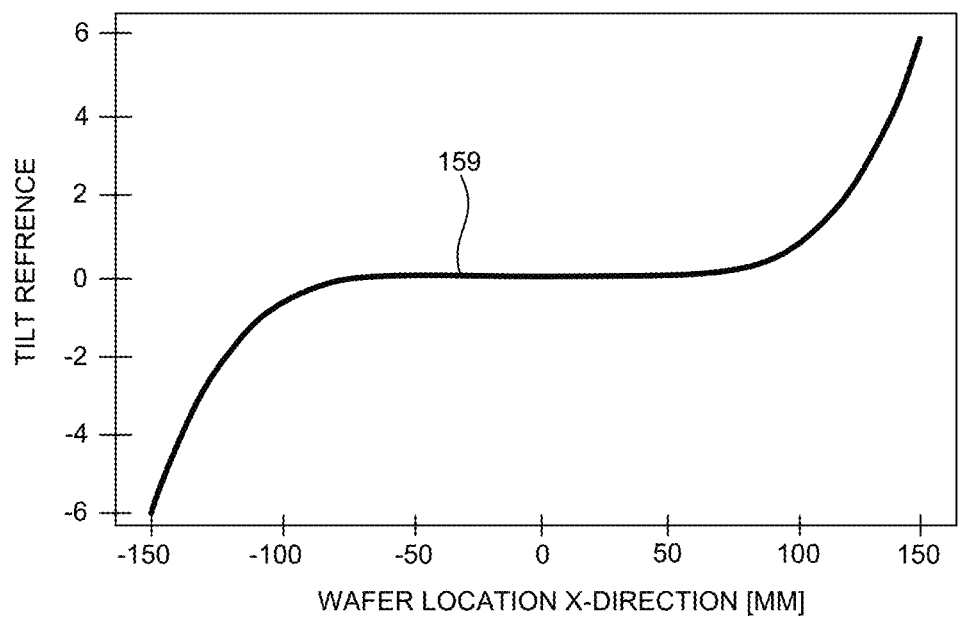
FIG. 8 is a plot illustrative of a third order polynomial function describing wafer tilt as a function of x-location on a wafer.

In a further aspect, the wafer tilt of the skew DOE wafer is approximated by a high order polynomial function (order greater than two) of the x-location on the wafer. FIG. 8 is a plot 159 of a third order polynomial function describing wafer tilt as a function of x-location on a wafer.

Figure 9:
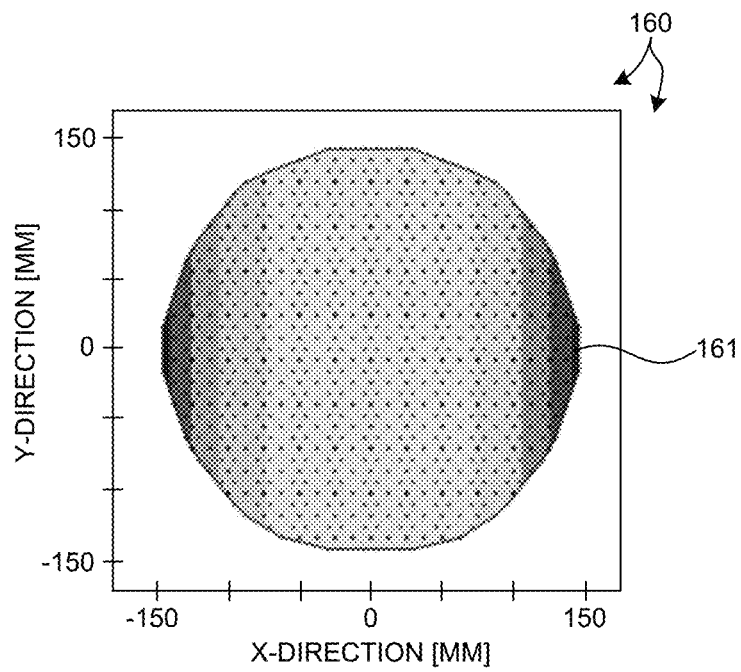
FIG. 9 is a plot illustrative of a map of wafer tilt of a skew Design Of Experiments (DOE) wafer.

FIG. 9 is a plot 160 illustrative of a map of wafer tilt of a skew DOE wafer 161. As depicted in FIG. 9, the programmed wafer tilt varies in the x-direction only, and the magnitude of wafer tilt is approximated by a high order polynomial function, such as the polynomial illustrated in FIG. 8. In one example, a wafer tilt model is trained based on measurements of skew DOE wafer 161 and the programmed values of wafer tilt of skew DOE wafer 161.

In a further aspect, the trained model is employed to accurately estimate wafer tilt from measurements of nominal production wafers fabricated with the same nominal structures as the DOE wafers. In this manner, the trained model enables measurement of wafer tilt independent of overlay.

Figure 10:
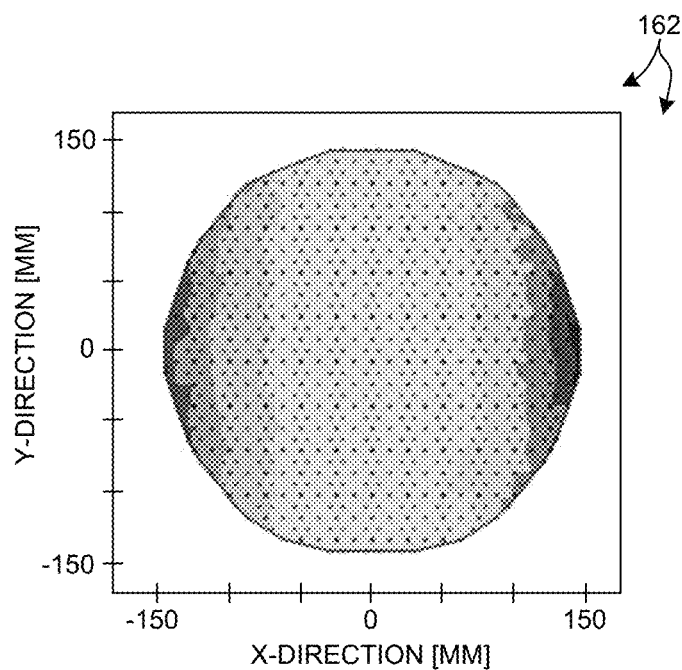
FIG. 10 is a plot illustrative of a map of values of wafer tilt estimated by a trained wafer tilt model based on measurements of a skew DOE wafer.
Figure 11A:
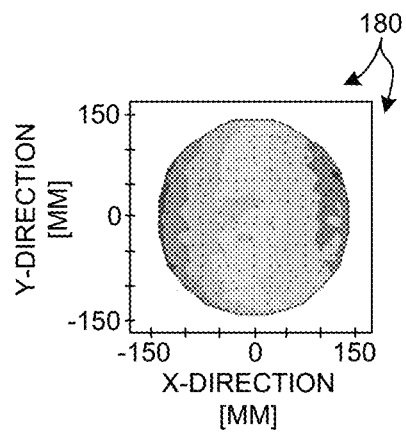
FIGS. 11A-F illustrate maps of estimated values of tilt as estimated by a trained wafer tilt model for six different nominal production wafers, respectively.
Figure 11B:
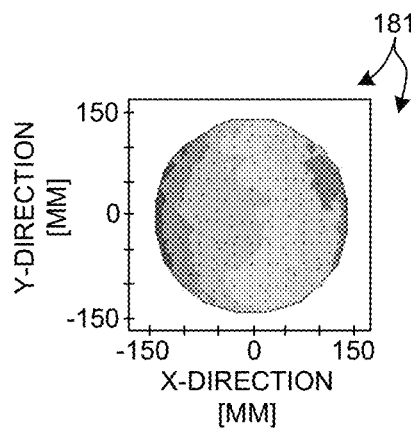
Figure 11C:
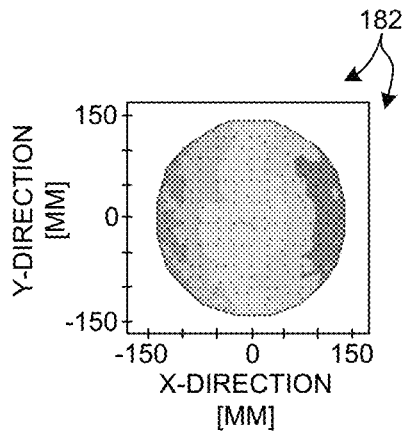
Figure 11D:
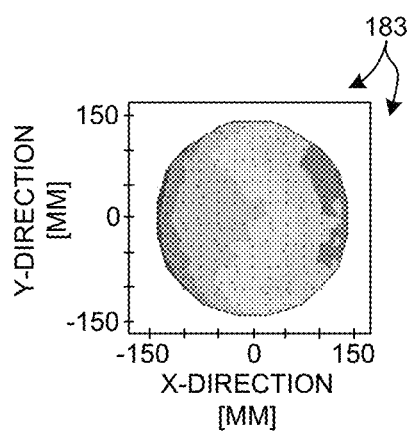
Figure 11E:
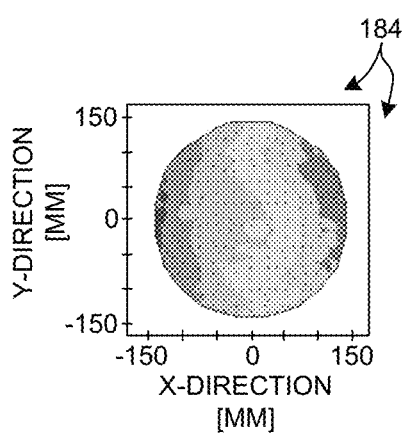
Figure 11F:
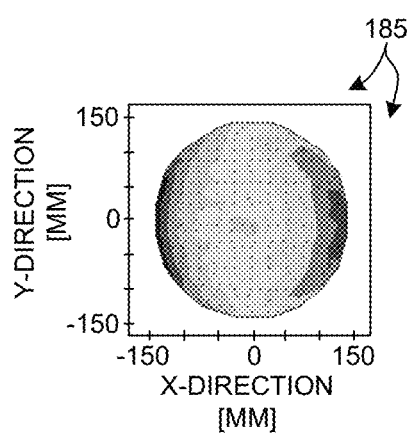

FIG. 10 is a plot 162 illustrative of a map of values of wafer tilt estimated by the trained wafer tilt model based on measurements of the skew DOE wafer 161. As illustrated in FIGS. 9 and 10, the predicted values of wafer tilt match depicted in FIG. 10 closely match the programmed values of wafer tilt depicted in FIG. 9.

FIGS. 11A-F illustrate maps 180-185 of estimated values of tilt as estimated by a trained wafer tilt model six different nominal production wafers, respectively. The nominal production wafers have unknown values of wafer tilt. The variation of tilt is successfully captured on nominal production wafers using a wafer tilt model trained on an overlay skew DOE wafer. Furthermore, the variation of tilt is similar to the analytical tilt function illustrated in FIG. 8.

In general, measurement signals employed to estimate wafer tilt and overlay as described herein are measurement signals from one or more metrology tools. The one or more metrology tools may include optical spectroscopic tools such as a Mueller ellipsometer, x-ray based metrology tools, electron beam metrology tools, etc.

In a further embodiment, system 100 may include one or more computing systems 130 employed to perform measurements in accordance with the methods described herein. The one or more computing systems 130 may be communicatively coupled to the detector 126. In one aspect, the one or more computing systems 130 are configured to receive measurement data 170 associated with measurements of metrology targets disposed on specimen 120.

It should be recognized that the various steps described throughout the present disclosure may be carried out by a single computer system 130 or, alternatively, a multiple computer system 130. Moreover, different subsystems of the system 100, such as the detector 126, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to detector 126 in any manner known in the art. For example, the one or more computing systems 130 may be coupled to computing systems associated with detector 126. In another example, detector 126 may be controlled directly by a single computer system coupled to computer system 130.

The computer system 130 of metrology system 100 may be configured to receive and/or acquire data or information from the subsystems of the system (e.g., detector 126 and the like) by a transmission medium that may include wireline and/or wireless portions. In this manner, the transmission medium may serve as a data link between the computer system 130 and other subsystems of the system 100.

Computer system 130 of metrology system 100 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology system 100, external memory, a reference measurement source, or other external systems). For example, the computing system 130 may be configured to receive measurement data from a storage medium (i.e., memory 132 or an external memory) via a data link. For instance, measurement results obtained using detector 126 may be stored in a permanent or semi-permanent memory device (e.g., memory 132 or an external memory). In this regard, the measurement results may be imported from on-board memory or from an external memory system. Moreover, the computer system 130 may send data to other systems via a transmission medium. For instance, a measurement model or an estimated value of wafer tilt or overlay 171 determined by computer system 130 may be communicated and stored in an external memory. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 5, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

In general, the metrology targets used for training are fabricated on one or more Design Of Experiments (DOE) wafers. In some examples, each DOE wafer is exposed with known, programmed skew overlay. The programmed skew overlay may have different values within a field of a DOE wafer, between different fields of a DOE wafer, or between different DOE wafers. Typically, the range of programmed skew overlay variations designed to be the same or greater than the expected variation in overlay (i.e., overlay process window). In this manner, the measurement sites interrogate different locations on the wafer surface that correspond with different overlay values.

In some other examples, the value of actual overlay associated with each metrology target is estimated by measurement of each metrology target with a trusted, reference metrology system. For example, any of a critical dimension, scanning electron microscope (CD-SEM), X-ray enhanced SEM, optical critical dimension tool, transmission electron microscope (TEM), and a small angle X-ray scatterometry (SAXS) tool may be employed as a reference metrology system. In one example, the value of actual overlay is estimated by performing SCOL or IBO measurements at multiple azimuth angles and subtracting the tool induced shift (TIS) errors.

In some embodiments, the measurement model is implemented as a neural network model. In one example, the number of nodes of the neural network is selected based on a number of features extracted from the training data. In other examples, the measurement model may be implemented as a linear model, a polynomial model, a response surface model, a support vector machines model, a decision tree model, a random forest model, or other types of models. In some examples, the measurement model may be implemented as a combination of models. The model is trained such that its output fits the defined variations in wafer tilt for all the measured signals in the wafer tilt variation space defined by the set of DOE metrology targets.

A variety of different metrology targets may be contemplated within the scope of this invention. In some embodiments, the metrology targets are based on conventional line/space targets. In some other embodiments, the metrology targets are device-like structures. In some other embodiments, the metrology targets are the actual devices themselves, thus no specialized metrology target is employed.

The training targets may be provided on a separate training wafer or on a production wafer. In some examples, the metrology targets are located in a scribeline of a production wafer. In some other examples, the metrology targets are located in the active die area.

In some embodiments, the measurements used for model training are performed in a scribeline area and subsequent measurements are performed in a periodic area of the actual device.

In some embodiments, multiple, different targets offset in orthogonal directions are employed in each die. This may be advantageous to minimize the effects of underlayers on measurement accuracy.

As described hereinbefore, the measurement methods and systems described herein are not constrained to specialized targets. In general, any target that exhibits sensitivity to wafer tilt and overlay when measured by the available measurement system may be employed in accordance with the methods and systems described herein.

Figure 12:
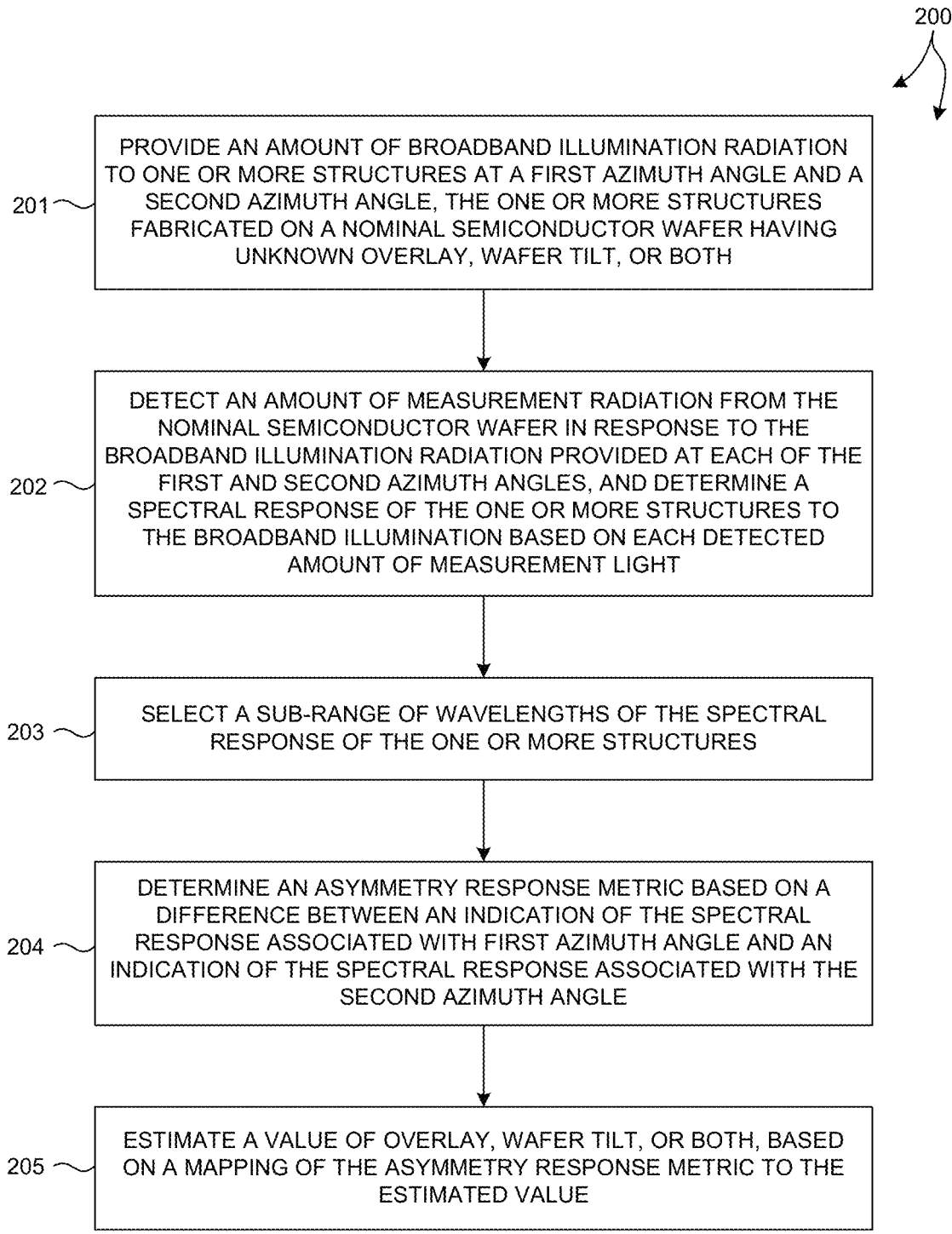
FIG. 12 illustrates a method for estimating overlay or wafer tilt based on asymmetry response metrics and known wafer statistics as described herein.

FIG. 12 illustrates a method 200 suitable for implementation by a metrology system such as metrology system 100 illustrated in FIG. 1 of the present invention. In one aspect, it is recognized that data processing blocks of method 200 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 201, an amount of broadband illumination radiation is provided to one or more structures at a first azimuth angle and a second azimuth angle. The one or more structures are fabricated on a nominal semiconductor wafer having unknown overlay, wafer tilt, or both.

In block 202, an amount of measurement radiation from the nominal semiconductor wafer is detected in response to the broadband illumination radiation provided at each of the first and second azimuth angles. A spectral response of the one or more structures to the broadband illumination is determined based on each detected amount of measurement light.

In block 203, a sub-range of wavelengths of the spectral response of the one or more structures is selected.

In block 204, an asymmetry response metric is determined based on a difference between an indication of the spectral response associated with first azimuth angle and an indication of the spectral response associated with the second azimuth angle.

In block 205, a value of overlay, wafer tilt, or both, is estimated based on a mapping of the asymmetry response metric to the estimated value.

Figure 13:
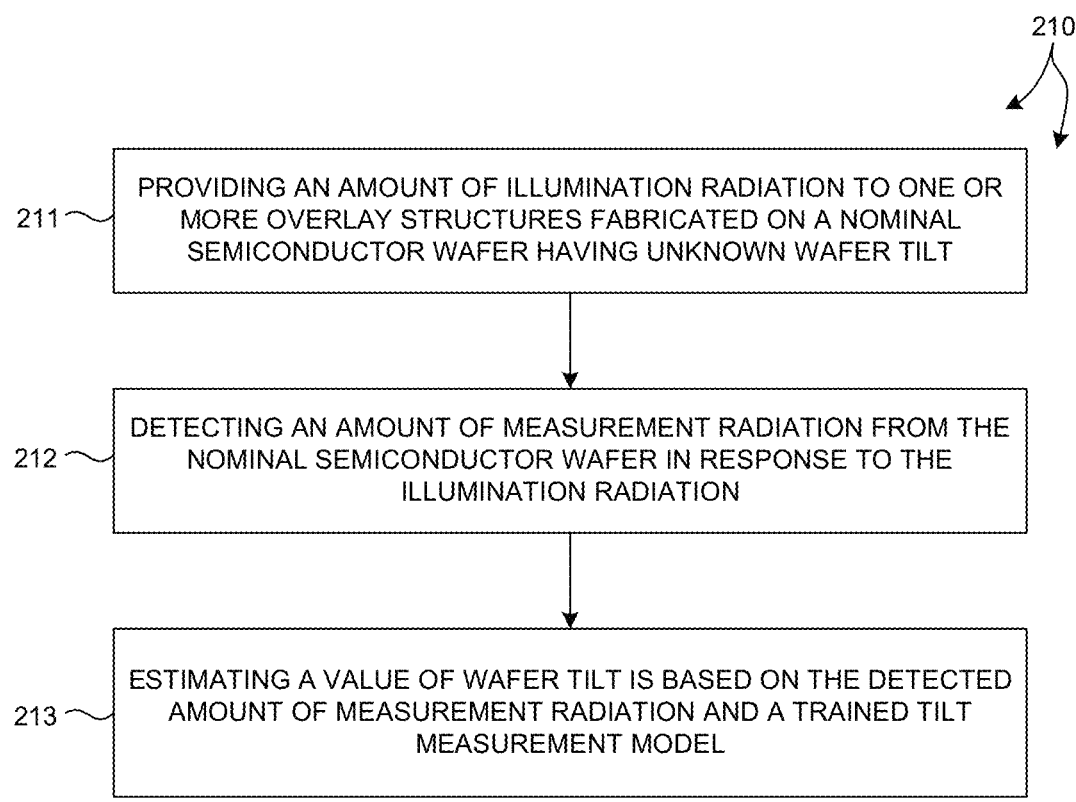
FIG. 13 illustrates a method for estimating wafer tilt based on trained measurement model as described herein.

FIG. 13 illustrates a method 210 suitable for implementation by a metrology system such as metrology system 100 illustrated in FIG. 1 of the present invention. In one aspect, it is recognized that data processing blocks of method 210 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 211, an amount of illumination radiation is provided to one or more overlay structures fabricated on a nominal semiconductor wafer having unknown wafer tilt.

In block 212, an amount of measurement radiation from the nominal semiconductor wafer is detected in response to the illumination radiation.

In block 213, a value of wafer tilt is estimated based on the detected amount of measurement radiation and a trained tilt measurement model.

In a further aspect, measurement data from multiple, different targets are collected for model building, training, and measurement. The use of measurement data associated with multiple targets having different structure, but formed by the same process conditions and programmed values increases the information embedded in the model and reduces the overlay correlation to process or other parameter variations. The additional information embedded in the model allows for a decoupling of information content associated with overlay from information associated with other parameters (e.g., film thicknesses, CD, etc.) that may affect the measured signals in a similar manner. In these examples, the use of training data that includes measurements of multiple, different targets at one or more measurement sites enables more accurate overlay estimation. In some examples, a mixture of isolated and dense line/space targets is employed to decouple overlay from underlayer effects.

In another further aspect, signals from multiple targets can be processed to reduce sensitivity to process variations and increase sensitivity to the parameters of interest. In some examples, signals from different targets are subtracted from one another. In some other examples, signals from different targets are fit to a model, and the residuals are used to build, train, and use the measurement model as described herein. In one example, signals from two different targets are subtracted to eliminate, or significantly reduce, the effect of process noise in each measurement result. In general, various mathematical operations can be applied between the signals from different targets to determine signals with reduced sensitivity to process variations and increased sensitivity to the parameters of interest.

In another further aspect, measurement data derived from measurements performed at multiple values of one or more measurement system parameters are collected for model building, training, and measurement. By way of non-limiting example, measurements performed at multiple illumination wavelengths, polarizations, etc., are employed to train a measurement model and perform measurements using the trained measurement model as described herein.

In another further aspect, measurement data derived from measurements performed by a combination of multiple, different measurement techniques is collected for model building, training, and measurement. The use of measurement data associated with multiple, different measurement techniques increases the information content in the combined set of signals and reduces the overlay correlation to process or other parameters variations. Measurement data may be derived from measurements performed by any combination of multiple, different measurement techniques. In this manner, different measurement sites may be measured by multiple, different measurement techniques (e.g., optical, x-ray, electron beam, and other sources of signal information) to enhance the measurement information available for estimation of parameters of interest.

In general, any measurement technique, or combination of two or more measurement techniques may be contemplated within the scope of this patent document as the data is in vector form. Because the techniques as described herein operate on vectors of data, each collected signal is treated independently. In addition, it is possible to concatenate data from multiple, different metrologies, regardless of whether the data is two dimensional data, one dimensional data, or even single point data.

Exemplary measurement techniques that may provide data for analysis in accordance with the metrology techniques described herein include, but are not limited to, an imaging reflectometer, an imaging spectroscopic reflectometer, a polarized spectroscopic imaging reflectometer, a scanning reflectometer system, a system with two or more reflectometers capable of parallel data acquisition, a system with two or more spectroscopic reflectometers capable of parallel data acquisition, a system with two or more polarized spectroscopic reflectometers capable of parallel data acquisition, a system with two or more polarized spectroscopic reflectometers capable of serial data acquisition without moving the wafer stage or moving any optical elements or the reflectometer stage, imaging spectrometers, imaging system with wavelength filter, imaging system with longpass wavelength filter, imaging system with short-pass wavelength filter, imaging system without wavelength filter, interferometric imaging system, imaging ellipsometer, imaging spectroscopic ellipsometer, a scanning ellipsometer system, a system with two or more ellipsometers capable of parallel data acquisition, a system with two or more ellipsometers capable of serial data acquisition without moving the wafer stage or moving any optical elements or the ellipsometer stage, a Michelson interferometer, a Mach-Zehnder interferometer, a Sagnac interferometer, a scanning angle of incidence system, and a scanning azimuth angle system. Furthermore, in general, measurement data collected by different measurement technologies and analyzed in accordance with the methods described herein may be collected from multiple tools, rather than one tool integrating multiple technologies.

In another further aspect, signals measured by multiple metrologies can be processed to reduce sensitivity to process variations and increase sensitivity to the parameters of interest. In some examples, signals from targets measured by different metrologies are subtracted from one another. In some other examples, signals from targets measured by different metrologies are fit to a model, and the residuals are used to build, train, and use the measurement model as described herein. In one example, signals from a target measured by two different metrologies are subtracted to eliminate, or significantly reduce, the effect of process noise in each measurement result. In general, various mathematical operations can be applied between the signals measured by different metrologies to determine signals with reduced sensitivity to process variations and increased sensitivity to the parameters of interest.

In general, signals from multiple targets each measured by multiple metrology techniques increases the information content in the combined set of signals and reduces the overlay correlation to process or structural parameter variations.

In some examples, the model building, training, and measurement methods described herein are implemented as an element of a SpectraShape® optical critical-dimension metrology system available from KLA-Tencor Corporation, Milpitas, California, USA. In this manner, the model is created and ready for use immediately after the DOE wafer spectra are collected by the system.

In some other examples, the model building and training methods described herein are implemented off-line, for example, by a computing system implementing AcuShape® software available from KLA-Tencor Corporation, Milpitas, California, USA. The resulting, trained model may be incorporated as an element of an AcuShape® library that is accessible by a metrology system performing measurements.

In another further aspect, the metrology system employed to perform measurements as described herein (e.g., metrology system 100) includes an infrared optical measurement system. In these embodiments, the metrology system 100 includes an infrared light source (e.g., an arc lamp, an electrode-less lamp, a laser sustained plasma (LSP) source, or a supercontinuum source). An infrared supercontinuum laser source is preferred over a traditional lamp source because of the higher achievable power and brightness in the infrared region of the light spectrum. In some examples, the power provided by the supercontinuum laser enables measurements of overlay structures with opaque film layers.

A potential problem in overlay measurement is insufficient light penetration to the bottom grating. In many examples, there are non-transparent (i.e., opaque) film layers between the top and the bottom gratings. Examples of such opaque film layers include amorphous carbon, tungsten silicide ($WSI_x$), tungsten, titanium nitride, amorphous silicon, and other metal and non-metal layers. Often, illumination light limited to wavelengths in the visible range and below (e.g., between 250 nm and 700 nm) does not penetrate to the bottom grating. However, illumination light in the infrared spectrum and above (e.g., greater than 700 nm) often penetrates opaque layers more effectively.

In yet another aspect, the measurement results described herein can be used to provide active feedback to a process tool (e.g., lithography tool, etch tool, deposition tool, etc.). For example, values of overlay error and wafer tilt determined using the methods described herein can be communicated to a lithography tool to adjust the lithography system to achieve a desired output. In a similar way etch parameters (e.g., etch time, diffusivity, etc.) or deposition parameters (e.g., time, concentration, etc.) may be included in a measurement to provide active feedback to etch tools or deposition tools, respectively.

In general, the systems and methods described herein can be implemented as part of the process of off-line or on-tool measurement.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
    an illumination source configured to provide an amount of broadband illumination radiation to one or more structures at a first azimuth angle and a second azimuth angle, the one or more structures fabricated on a nominal semiconductor wafer having unknown overlay, wafer tilt, or both;
    a detector configured to detect an amount of measurement radiation from the nominal semiconductor wafer in response to the broadband illumination radiation provided at each of the first and second azimuth angles, and determine a spectral response of the one or more structures to the broadband illumination based on each detected amount of measurement light; and
    a computing system configured to:
        select a sub-range of wavelengths of the spectral response of the one or more structures, wherein the selecting of the sub-range of wavelengths involves selecting the sub-range of wavelengths having a spectral response that exceeds a predetermined threshold value within the sub-range of wavelengths;
        determine an asymmetry response metric based on a difference between an indication of the spectral response associated with first azimuth angle and an indication of the spectral response associated with the second azimuth angle, wherein each measured spectral response includes spectra associated with multiple elements of a Mueller matrix, wherein the indication of the spectral response associated with the first azimuth angle is a summation of two or more off-diagonal elements of the Mueller matrix associated with the spectral response associated with the first azimuth angle, and wherein the indication of the spectral response associated with the second azimuth angle is a summation of the two or more off-diagonal elements of the Mueller matrix associated with the spectral response associated with the second azimuth angle;
        estimate a value of overlay, wafer tilt, or both, based on a mapping of the asymmetry response metric to the estimated value.

2. The metrology system of claim 1, wherein the determining of the asymmetry response metric involves integrating the difference across the selected sub-range of wavelengths.

3. The metrology system of claim 1, wherein the summation of the two or more off-diagonal elements of the Mueller matrix includes a sum of a first element and a second element of a four element by four element Mueller Matrix, wherein the first element corresponds to a third row and a first column of the four element by four element Mueller Matrix and the second element corresponds to a first row and a third column of the four element by four element Mueller Matrix.

4. The metrology system of claim 1, wherein the first azimuth angle and the second azimuth angle are separated by 180 degrees.

5. The metrology system of claim 1, wherein the nominal semiconductor wafer is not a Design Of Experiments (DOE) wafer.

6. The metrology system of claim 1, the computing system further configured to:
    communicate the value of overlay, wafer tilt, or both, to a semiconductor fabrication tool, wherein the semiconductor fabrication tool adjusts a control parameter of a semiconductor fabrication process based on the value of overlay, wafer tilt, or both, to reduce structural defects characterized by the measured asymmetry.

7. The metrology system of claim 1, wherein the selecting involves selecting a first subset of wavelengths for estimating overlay and a second subset of wavelengths for estimating tilt, wherein the first subset is different from the second subset.

8. A method comprising:
    providing an amount of broadband illumination radiation to one or more structures at a first azimuth angle and a second azimuth angle, the one or more structures fabricated on a nominal semiconductor wafer having unknown overlay, wafer tilt, or both;
    detecting an amount of measurement radiation from the nominal semiconductor wafer in response to the broadband illumination radiation provided at each of the first and second azimuth angles;
    determining a spectral response of the one or more structures to the broadband illumination based on each detected amount of measurement light;
    selecting a sub-range of wavelengths of the spectral response of the one or more structures, wherein the selecting of the sub-range of wavelengths involves selecting the sub-range of wavelengths having a spectral response that exceeds a predetermined threshold value within the sub-range of wavelengths;
    determining an asymmetry response metric based on a difference between an indication of the spectral response associated with first azimuth angle and an indication of the spectral response associated with the second azimuth angle, wherein each measured spectral response includes spectra associated with multiple elements of a Mueller matrix, wherein the indication of the spectral response associated with the first azimuth angle is a summation of one or more off-diagonal elements of the Mueller matrix associated with the spectral response associated with the first azimuth angle, and wherein the indication of the spectral response associated with the second azimuth angle is a summation of the one or more off-diagonal elements of the Mueller matrix associated with the spectral response associated with the second azimuth angle; and estimating a value of overlay, wafer tilt, or both, based on a mapping of the asymmetry response metric to the estimated value.

9. The method of claim 8, wherein the determining of the asymmetry response metric involves integrating the difference across the selected sub-range of wavelengths.

10. The method of claim 8, wherein the first azimuth angle and the second azimuth angle are separated by 180 degrees.

11. A metrology system, comprising:
an illumination source configured to provide an amount of illumination radiation to one or more overlay structures fabricated on a nominal semiconductor wafer having unknown wafer tilt;
a detector configured to detect an amount of measurement radiation from the nominal semiconductor wafer in response to the illumination radiation; and
a computing system configured to:
estimate a value of wafer tilt based on the detected amount of measurement radiation and a trained, machine learning based tilt measurement model that functionally relates the detected amount of measurement radiation to the value of wafer tilt independent of overlay of the one or overlay structures under measurement,
the illumination source further configured to provide an amount of broadband illumination radiation to one or more structures at a first azimuth angle and a second azimuth angle, the one or more structures fabricated on a nominal semiconductor wafer having unknown wafer tilt;
the detector further configured to detect an amount of measurement radiation from the nominal semiconductor wafer in response to the broadband illumination radiation provided at each of the first and second azimuth angles, and determine a spectral response of the one or more structures to the broadband illumination based on each detected amount of measurement light; and
the computing system further configured to:
select a sub-range of wavelengths of the spectral response of the one or more structures;
determine an asymmetry response metric based on a difference between an indication of the spectral response associated with first azimuth angle and an indication of the spectral response associated with the second azimuth angle;
estimate a value of wafer tilt based on a mapping of the asymmetry response metric to the estimated value; and
train the tilt measurement model based on the detected spectral response and the estimated value of wafer tilt.

12. The metrology system of claim 11,
the illumination source further configured to provide an amount of illumination radiation to one or more overlay structures fabricated on a Design Of Experiments (DOE) semiconductor wafer having different, known, programmed values of skew;
the detector further configured to detect an amount of DOE measurement radiation from the DOE semiconductor wafer in response to the illumination radiation; and
the computing system further configured to train the tilt measurement model based on the DOE measurement data and the programmed values of skew.

13. The metrology system of claim 11, wherein the tilt measurement model is any of a linear model, a polynomial model, a neural network model, a support vector machines model, a decision tree model, and a random forest model.

14. The metrology system of claim 11, wherein the amount of measurement data includes measurements acquired by a plurality of different metrology techniques.

15. The metrology system of claim 11, wherein a value of a lithography process variable is adjusted based on the estimated value of wafer tilt.

16. The metrology system of claim 11, wherein the providing the amount of illumination radiation and the detecting of the amount of measurement radiation from each of the overlay structures are performed at a plurality of different values of one or more measurement system parameters.

17. A method comprising:
providing an amount of broadband illumination radiation to one or more structures at a first azimuth angle and a second azimuth angle, the one or more structures fabricated on a nominal semiconductor wafer having unknown wafer tilt;
detecting an amount of measurement radiation from the nominal semiconductor wafer in response to the broadband illumination radiation provided at each of the first and second azimuth angles;
determining a spectral response of the one or more structures to the broadband illumination based on each detected amount of measurement light;
selecting a sub-range of wavelengths of the spectral response of the one or more structures;
determining an asymmetry response metric based on a difference between an indication of the spectral response associated with first azimuth angle and an indication of the spectral response associated with the second azimuth angle;
estimating a value of wafer tilt based on a mapping of the asymmetry response metric to the estimated value;
training a machine learning based tilt measurement model based on the detected spectral response and the estimated value of wafer tilt, the trained machine learning based tilt measurement model functionally relates the detected amount of measurement radiation to the value of wafer tilt;
providing an amount of illumination radiation to one or more overlay structures fabricated on a nominal semiconductor wafer having unknown wafer tilt;
detecting an amount of measurement radiation from the nominal semiconductor wafer in response to the illumination radiation; and
estimating a value of wafer tilt based on the detected amount of measurement radiation and the trained, machine learning based tilt measurement model that functionally relates the detected amount of measurement radiation to the value of wafer tilt independent of overlay of the one or overlay structures under measurement.

18. The method of claim 17, further comprising:
providing an amount of illumination radiation to one or more overlay structures fabricated on a Design Of Experiments (DOE) semiconductor wafer having different, known, programmed values of skew;
detecting an amount of DOE measurement radiation from the DOE semiconductor wafer in response to the illumination radiation; and
training the tilt measurement model based on the DOE measurement data and the programmed values of skew.

\* \* \* \* \*